@@ -1,0 +1,1 @@
United States Patent [19]

Adachi et al.

[11] 3,808,059

[45] Apr. 30, 1974

[54] METHOD FOR MANUFACTURING III-V COMPOUND SEMICONDUCTOR DEVICE

[75] Inventors: Eiichi Adachi, Mitaka; Kazutoshi Saito, Hachioji, both of Japan

[73] Assignee: Hitachi, Ltd., Tokyo, Japan

[22] Filed: Jan. 24, 1972

[21] Appl. No.: 220,177

[30] Foreign Application Priority Data

Jan. 22, 1971 Japan.................................. 46-1582

[52] U.S. Cl................... 148/187, 148/186, 148/189, 29/576

[51] Int. Cl. .............................................. H01l 7/34

[58] Field of Search ............... 148/189, 187; 29/576

[56] References Cited

UNITED STATES PATENTS

| | | | |
|---|---|---|---|
| 3,629,018 | 12/1971 | Henderson et al. | 148/187 |
| 3,698,071 | 10/1972 | Hall | 148/186 X |
| 3,602,984 | 9/1971 | Trent | 148/187 X |
| 3,298,879 | 1/1967 | Scott et al. | 148/189 X |
| 3,697,334 | 10/1972 | Yamamoto et al. | 148/188 X |
| 3,615,941 | 10/1971 | Yamada et al. | 148/187 |

*Primary Examiner*—G. T. Ozaki
*Attorney, Agent, or Firm*—Craig and Antonelli

[57] ABSTRACT

In a method for manufacturing a III–V compound semiconductor device in which a second conductivity type impurity is selectively diffused into part of one main plane of a first conductivity type III–V compound semiconductor crystal, thereby forming a thin diffusion layer, the improvement is characterized in that an $Al_2O_3$ film is first formed on the main plane, part of the $Al_2O_3$ film corresponding to the area on the semiconductor crystal where the impurity is diffused is removed by etching, a $SiO_2$ film is formed on the $Al_2O_3$ film and on the main plane of the compound semiconductor crystal in the area exposed by etching, part of the $SiO_2$ film in direct contact with the main plane of the compound semiconductor crystal is etched, thereby exposing part of the main plane of the semiconductor crystal, and the second conductivity type impurity is diffused through the exposed part of the semiconductor crystal whereby the second conductivity type thin diffusion layer is formed spreading substantially over the whole of such part of said compound semiconductor as has direct contact with said $SiO_2$ film.

7 Claims, 7 Drawing Figures

METHOD FOR MANUFACTURING III-V COMPOUND SEMICONDUCTOR DEVICE

BACKGROUND OF THE INVENTION

This invention relates to a method for selectively diffusing an impurity into a III–V compound semiconductor.

DESCRIPTION OF THE PRIOR ART

In the prior art, an impurity was selectively diffused into a III–V compound semiconductor in the following manner. A double-layer film comprising $Al_2O_3$ and $SiO_2$ ($P_2O_5$) or the like was formed on the compound semiconductor, the necessary part of the film through which an impurity was diffused was removed by etching and, while heating the compound semiconductor, the impurity was diffused thereinto through the window disposed by said etching. In this method, however, there were difficulties in obtaining a shallow diffusion layer to a depth smaller than $1.5\mu$, with a high reproducibility. Furthermore, the prior art method gave rise to the problem that when the diffusion depth was shallow, a heavy metal was diffused into the semiconductor crystal in the electrode forming process, to result in degrading the characteristic of the junction directly beneath the electrode.

SUMMARY OF THE INVENTION

A general object of this invention is to provide a method for selectively diffusing an impurity into a III–V compound semiconductor free of prior art problems.

Briefly, the method of this invention is characterized in that a III–V compound semiconductor crystal is coated with an $Al_2O_3$ film, part of the film located on the area of the crystal into which an impurity is diffused is removed by etching, a $SiO_2$ film is deposited on the removed area, part of the $SiO_2$ film in contact with the semiconductor crystal is etched, thereby exposing part of said semiconductor crystal, and the impurity is diffused thereinto through the exposed part of the crystal. According to this method, the junction formed directly beneath the exposed part of the semiconductor crystal can be made deep enough, and most of the other part can be formed into a shallow junction. Hence, if electrodes are formed in the exposed part of the semiconductor crystal, the foregoing prior art problems can be solved.

More specifically, according to this invention, it has been experimentally discovered that when an impurity is diffused thereinto through a window on the $SiO_2$ film formed on the III–V compound semiconductor crystal, a diffusion layer being very thin compared with the depth of the diffusion in the direction perpendicular to the boundary in the window portion between the $SiO_2$ film and the compound semiconductor crystal is spread anomalously in parallel with the boundary. Such spreading phenomenon occurs more conspicuously as the diffusion temperature increases and the diffusion time becomes longer. For example, when zinc is diffused into a $GaAs_{0.6}P_{0.4}$ crystal at 750° C for about 4 hours, the diffusion depth directly beneath the window disposed on the $SiO_2$ film is $3\mu$, the depth of the shallow diffusion part is $1\mu$, and its spread is $130\mu$. This phenomenon is caused by Ga atoms in the compound semiconductor being diffused into $SiO_2$ through the boundary, thereby forming vacancies of Ga, and anomalously rapid diffusion takes place through the vacancies. When an $Al_2O_3$ film or the like is deposited on the compound semiconductor, the possibility of this phenomenon is relatively small. This is thought to occur because the diffusion coefficient of Ga into $Al_2O_3$ is smaller than that of Ga into $SiO_2$. Therefore, when an $SiO_2$ film is deposited on the part where an impurity is diffused and an $Al_2O_3$ film is deposited directly on the compound semiconductor in the area other than said diffusion part, it becomes possible to form a shallow diffusion layer only in the region directly beneath the $SiO_2$ film. In other words, a relatively deep diffusion layer is formed in the area where neither the $SiO_2$ film nor the $Al_2O_3$ film is deposited. Therefore, in the electrode forming process, there are no possibilities of deteriorating the characteristics at the junction directly beneath the electrode.

According to this invention, a silicate glass including a III group or V group element, such as $SiO_2$ ($P_2O_5$) and $SiO_2$ ($B_2O_3$) may be used instead of $SiO_2$.

According to one aspect of the present invention for realizing its method, a compound semiconductor crystal is heated and, while heating, an $Al_2O_3$ film is formed on one main plane of said crystal and then the part of this film corresponding to the area where an impurity is diffused is removed by etching, an $SiO_2$ film is formed on the $Al_2O_3$ film, an etching window, whose area is smaller than the place where an impurity is diffused, is formed in the part of said $SiO_2$ film in direct contact with said crystal, and the impurity is diffused thereinto through said window. The selective diffusion mask formed in the above process can be utilized as a passivation film for the semiconductor device.

The method of this invention is highly useful not only for GaAs but also for compound semiconductors having the composition $GaAs_xP_{1-x}$ (where $0.5 \leqq x \leqq 1$) and $Ga_{1-x}Al_xAs$ (where $0 \leqq x \leqq 0.6$). When the ratio of GaP in the mixed crystal $GaAs_xP_{1-x}$ is large, the temperature for impurity diffusion must be increased. This temperature, for example, is about 800° to 900° C. At such high temperatures, however, it is impossible to realize desirable impurity diffusion even if $Al_2O_3$ is used for the diffusion mask. The maximum temperature at which $Al_2O_3$ is used for the diffusion mask is about 750° C for $GaAs_{0.5}P_{0.5}$. The same consideration is necessary as to the mixed crystal $Ga_{1-x}Al_xAs$ (where $0.6 \leqq x \leqq 1$).

If the diffusion temperature is below about 600° C, a long time is required to obtain the necessary depth of diffusion junction directly below the electrode. For example, it takes about 36 hours for a $2\mu$ deep diffusion junction when zinc is diffused into $GaAs_xP_{1-x}$ ($x=0.4$) at about 600° C.

Features and advantages of this invention will be more apparent from the following specification of one illustrative embodiment in conjunction with the accompanying drawings.

DESCRIPTION OF THE PREFERRED EMBODIMENT

Figure 1:
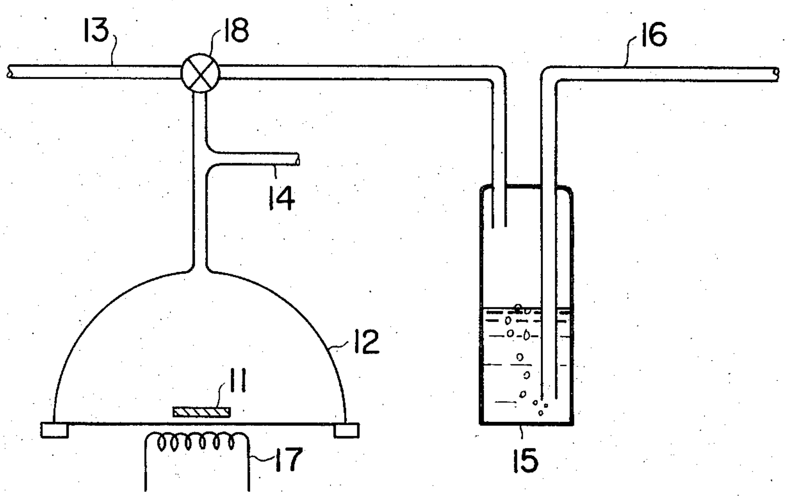
FIG. 1 is a diagram showing a device used for carrying out the method of this invention.

Described below is one embodiment of this invention wherein a diffusion mask is formed on a compound semiconductor GaAsP substrate by using a device for forming a selective diffusion mask making device as shown in FIG. 1.

In FIG. 1, the reference numeral 11 denotes an n-type GaAsP mixed crystal substrate having a specific resistance of $10^{-3}$ Ω-cm, 12 a quartz glass bell jar, 13 a pipe through which $SiH_4$ gas is introduced into the bell jar, 14 a pipe through which $O_2$ and $N_2$ gases are introduced thereinto, 15 a reservoir of an aluminum compound such as tri-iso-butyl aluminum or triethoxyaluminum, 16 a pipe for introducing thereinto $N_2$ gas which is used as the carrier of the aluminum compound, 17 a heating device, and 18 a switch cock.

Figure 2A:
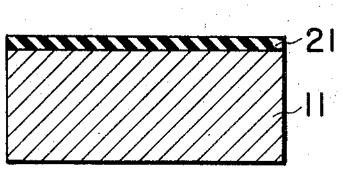
FIGS. 2*a* through 2*f* are diagrams illustrating the steps of the method of this invention.
Figure 2B:
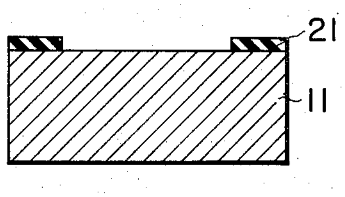
Figure 2C:
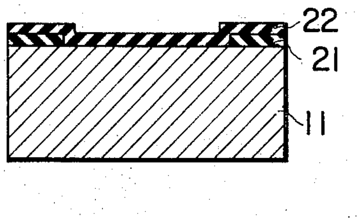
Figure 2D:
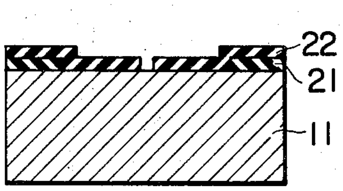
Figure 2E:
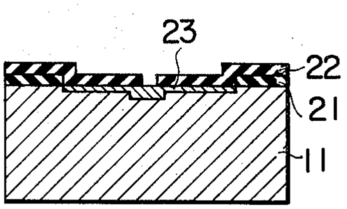
Figure 2F:
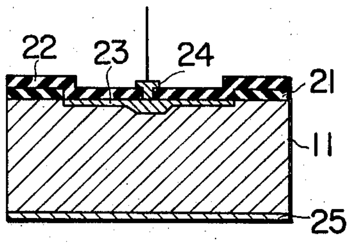

FIGS. 2a through 2f illustrate the production steps of the method according to this invention. An *n*-type $GaAs_xP_{1-x}$ (where $0.5 \leqq x \leqq 1$) substrate 11 is heated to a temperature of about 300° to about 500° C and, while heating, $N_2$ gas and aluminum compound vapor are supplied to the substrate 11, these gases are reacted by $O_2$ gas, whereby an $Al_2O_3$ film 21 is deposited on the GaAsP substrate. Practically, the necessary thickness of the $Al_2O_3$ film is about 1,000A, for example. To obtain this, it is necessary to carry out the reaction at about 400° C for about 15 minutes. A window is disposed in the necessary part of the $Al_2O_3$ film 21 by a known photoetching method, as shown in FIG. 2*b*. The GaAsP substrate 11 is heated to a temperature of about 300° to about 500° C, SiH gas and $N_2$ gas are supplied thereto to react with $O_2$ gas, whereby an $SiO_2$ film 22 is deposited on the substrate 11, as shown in FIG. 2*c*. The practically necessary thickness of the $SiO_2$ film is about 6,000A. As shown in FIG. 2*d*, a window is disposed in the necessary part of the $SiO_2$ film 22 by a known photoetching method. The resultant sample is taken out of the device as in FIG. 1 and placed together with 5mg of $ZnAs_2$ in a quartz tube and sealed, and then it is heated at about 750° C for about 4 hours. By this process, as shown in FIG. 2*e*, a 3μ thick diffusion layer 23 whose conductivity type is opposite to that of the substrate is formed directly beneath the window disposed on the $SiO_2$ film, and a 0.5 to 1μ thick diffusion layer 23 is formed beneath the window disposed on the $Al_2O_3$ film. Aluminum is deposited by evaporation on the $SiO_2$ film through said window, and an Au lead wire is bonded to this aluminum layer and used as electrode 24, for the diffusion layer 23. An Au-Ge alloy is bonded to the bottom of the GaAsP substrate and is used as an electrode 25 on the side of substrate. Thus, a diode as shown in FIG. 2f is obtained.

When the diode is forward-biased, light emission occurs in the window portion disposed on the $Al_2O_3$ film 21. Because the diode formed in the above manner has a shallow diffusion layer, its external quantum efficiency of light emission is greater than that of the diode obtainable by using a double layer $Al_2O_3$ and $SiO_2$ $(P_2O_5)$ as a diffusion mask, according to the prior art. Also, according to the invention, the $SiO_2$ film which covers most of the junction surface is heat-treated at the diffusion temperature and, hence it is fine-grained and highly resistant against moisture.

In the above embodiment, a silicate glass including a III group or V group element such as $SiO_2$ $(P_2O_5)$ and $SiO_2$ $(B_2O_3)$ may be used in place of $SiO_2$. Also, according to the invention, an n-type impurity may be diffused into a p-type GaAsP mixed crystal substrate, or GaAlAs or GaAs may be used instead of GaAsP.

While one specific embodiment of the invention and particular modifications thereof has been illustrated and described in detail, it is particularly understood that the invention is not limited or thereby.

We claim:

1. A method for manufacturing a III–V compound semiconductor device, comprising the following steps:

a. forming an $Al_2O_3$ film on a principal plane of a first conductivity type III–V compound semiconductor substrate;
b. removing a portion of said $Al_2O_3$ film corresponding to the part of said semiconductor crystal where an impurity is to be diffused, said $Al_2O_3$ film being formed by thermal decomposition of an organic compound selected from the group consisting of tri-iso-butyl aluminum and triethoxy-aluminum at a temperature of about 300° to about 500° C;
c. forming a silicate glass film on said $Al_2O_3$ film and on the principal plane of said compound semiconductor substrate in the part exposed in step (b), the thickness of said silicate glass film being about 6,000 A;
d. removing a portion of said silicate glass film in direct contact with the principal plane of said compound semiconductor substrate so that the part of said principal plane corresponding to said portion is exposed;
e. diffusing a second conductivity type impurity whose conductivity type is opposite to said first conductivity type into said substrate through said exposed part of the principal plane in the range of temperature between 600° and 750° C., whereby a second conductivity type diffusion layer is formed, said second conductivity type diffusion layer being spread substantially over the part of the compound semiconductor in direct contact with said silicate glass film;
f. disposing an electrode for said second conductivity type layer in said window; and
g. disposing an electrode for said first conductivity type layer in said first conductivity type semiconductor substrate.

2. A method for manufacturing a III–V compound semiconductor device in accordance with claim 1, in which said III–V compound semiconductor substrate is selected from among the group consisting of $GaAs_xP_{1-x}$ (where $0.5 \leqq x \leqq 1$) and $Ga_{1-x}Al_xAs$ (where $0 \leqq x \leqq 0.6$).

3. A method for manufacturing a III–V compound semiconductor device in accordance with claim 2, wherein said step (e) is carried out until the depth of said second conductivity type diffusion layer beneath said silicate glass film is between 0.5 and 1 micron.

4. A method for manufacturing a III–V compound semiconductor device in accordance with claim 1, in which said silicate glass contains an element selected from the group consisting of III group elements and V group elements.

5. A method for manufacturing a III–V compound semiconductor device in accordance with claim 1, in which said silicate glass is selected from the group consisting of $SiO_2$, $SiO_2$ $(P_2O_5)$ and $SiO_2$ $(B_2O_3)$.

6. A method for manufacturing a III–V compound semiconductor device in accordance with claim 1, in which said silicate glass is made of $SiO_2$.

7. A method for manufacturing a III–V compound semiconductor device in accordance with claim 1, wherein said step (g) comprises forming said electrode on the side of said substrate opposite said principal plane.

* * * * *